Jan. 21, 1969 TOMISABURO OKUMURA 3,422,528

METHOD OF PRODUCING SEMICONDUCTOR DEVICES

Filed March 20, 1967

3,422,528

METHOD OF PRODUCING SEMICONDUCTOR DEVICES

Tomisaburo Okumura, Kyoto, Japan, assignor to Matsushita Electronics Corporation, Osaka, Japan, a corporation of Japan Filed Mar. 20, 1967, Ser. No. 624,478
Claims priority, application Japan, Mar. 28, 1966, 41/19,501
U.S. Cl. 29—584 1 Claim
Int. Cl. H01l 7/54; H01l 7/24; B44d 1/20

ABSTRACT OF THE DISCLOSURE

A method of producing a semiconductor device by applying, prior to depositing a metal electrode onto the semiconductor, a D.C. field to an insulating film to transfer ions present in said insulating film to the surface portion thereof, and thereafter removing the portion of film where ions are collected, whereby a semiconductor device having an insulating film and stabilized characteristic is obtained due to elimination of ions such as alkali ions responsible for the unstable characteristic of semiconductor devices.

The present invention relates to a method for producing semiconductor devices having insulating films formed locally or entirely on the surfaces of the semiconductors.

It is the object of the present invention to eliminate the presence of alkali ions or other ions from such insulating films.

It may be pointed out as one of the recent tendencies in the field of semiconductor devices that efforts are being directed to the development of semiconductor devices utilizing thin insulating films formed on the surfaces of the semiconductors for the purpose of protecting the semiconductor devices from ambient atmosphere and affording the semiconductor devices with amplifying ability by altering the conductivity of the surface of the semiconductor by impressing a voltage thereto through such insulating film, as is practiced in the insulated gate field-effect transistors.

The material of the insulating film varies depending on the type of the semiconductor with which the insulating film is to be combined. For example, in case germanium is used as the semiconductor, the insulating film which is formed thereon consists usually of a silicon oxide or tetragonal germanium dioxide, and where silicon is used as the semiconductor, a silicon oxide is often used as the material of the insulating film. Where cadmium sulfide is used as the semiconductor, a silicon oxide and a magnesium fluoride are frequently adopted as the materials of the insulating films. Of all these combinations, those which are most often utilized is the combination of a silicon oxide film and a silicon semiconductor, and especially, the combination of a silicon dioxide ($SiO_2$) and a silicon semiconductor. Accordingly, in the examples of the semiconductor devices embodying the present invention, description will be based chiefly on the combination between a silicon semiconductor and a silicon dioxide film.

Typical examples of the prior art where an insulating film consists of silicon dioxide (hereinafter to be referred to merely as silicon oxide film) is used for the protection of the junction of a semiconductor device, are planar transistors, and a typical example where the film is utilized in a field-effect transistor are MOS transistors.

Silicon oxide films have thus been effectively utilized in the field of solid-state electronics. However, unsatisfactory results have been often encountered with respect to the stability of these films. In planar transistors, for example, such undesirable phenomena as an increase in the current when reversely biased, or a decrease in the breakdown voltage, or fluctuations of such current or voltage occurring in the midst of operation have been often encountered. In MOS transistors, on the other hand, there occurred changes in the values of drain current and transconductance during the operation of the devices or during the period of their storage at high temperature. It has been accepted, until now, that the occurrence of these inconveniences are due chiefly to the easily movable ions located in the silicon oxide films, and also it has become gradually confirmed that such ions consist of alkali ions such as $Li^+$ and $Na^+$.

The presnt invention will be more clearly understood by reading the following description in conjunction with the accompanying drawings, in which.

Now, description will be made more concretely by referring to FIGS. 1 and 2.

Figure 1:
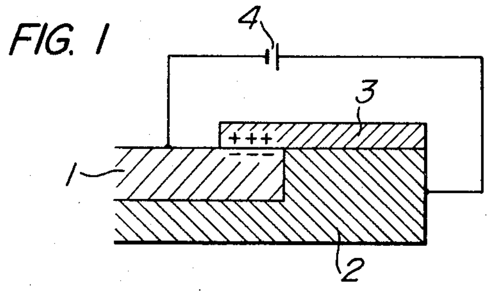
FIG. 1 is a diagrammatic illustration of the action of the base-collector junction in a conventional planar transistor.

FIG. 1 shows the junction between the base 1 and the collector 2 of an n-p-n type planar transistor. Alkali ions are present in the silicon oxide film 3. Let us now assume that the base 1 and the collector 2 are reversely biased by the potential of the power source 4. Then, the positively charged alkali ions located in the silicon oxide film 3 will move toward the base 1 and concentrate in that portion of the silicon film 3 close to the interface of said film and said base 1 which is made of p-type silicon, with a result that negative electrons collect themselves, due to the electrostatic inductance, in that portion of base 1 close to said interface, eventually converting the type of said portion of base 1 from p-type to n-type. Since, in this state, the base 1 and the collector 2 are rendered in the "on" state, the planar transistor is inoperable. In the event that the amount of alkali ions is very small, said transistor will not become inoperable. Nevertheless, there will arise such inconveniences as the increase in the current when reversely biased and the decrease in the breakdown voltage.

Figure 2:
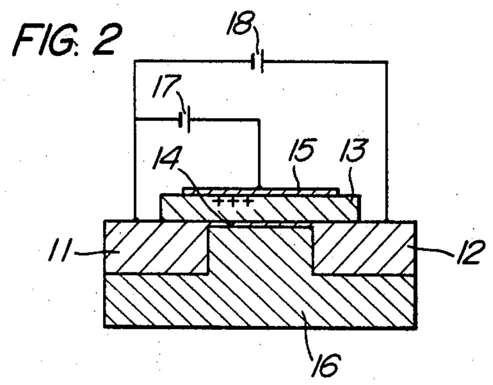
FIG. 2 is a diagrammatic illustration of the similar action in a field-effect transistor of the prior art.

FIG. 2 illustrates an n-channel MOS transistor, wherein reference numeral 11 represents a source; numeral 12 a drain; numeral 13 a silicon oxide film; numeral 14 a conductive channel; numeral 15 a gate; numeral 16 a silicon wafer; and numerals 17 and 18 represent power sources. Let us now assume that the source 11, the drain 12 and the gate 15 are biased as illustrated. The alkali ions located in the silicon oxide film 13 will move toward that portion of the film near the gate 15 on the side of the source 11 due to the bias voltage applied thereto from the power source 17 and due to the potential applied from the power source 18 between the source and the drain. Due to the difference in the potentials of the power sources 17 and 18, the alkali ions concentrate at different places. Also, in case there takes place a change in the mode of operation of the device from the state of its being actuated where heat is developed by the current flowing between the source and the drain to the state in which the power sources 17 and 18 are cut off and the device is not actuated, the alkali ions diffuse under the staying heat which has been caused by said current and distribute uniformly throughout the entire portions of the silicon film and thus there occurs a change in the pattern of distribution of the ions. Furthermore, where the device is kept at high temperature, there also takes place a change in the distribution pattern of the alkali ions. Since alkali ions are positively charged, a lateral or vertical transfer of their location will cause a change in the number of the electrons which are electrostatically induced in the channel 14, which will bring forth a change in the conductivity between the source and the drain, and this will in turn result in a change in the drain current and transconductance. In case alkali ions are present in the silicon oxide film of a MOS transistor, there will occur, depending on the mode of operation, a change in the characteristics of the device due to the easy movability of said alkali ions.

As has been discussed in connection with a planar transistor and a MOS transistor, the presence of alkali ions in the silicon oxide film brings about various undesirable effects on the characteristics of a semiconductor device. It is, therefore, mandatory that alkali ions be eliminated from the silicon oxide films and also from other insulating films during the process of manufacturing semiconductor devices. It is however, quite difficult, from the practical point of view, to completely expel alkali ions from semiconductor devices during the manufacturing process, in view of the fact that alkali ions are widely distributed not only in the human body but also in the water and chemical agents used.

The present invention aims to provide a method of easily and completely removing alkali ions which bring forth the foregoing various ill effects from silicon oxide films, by applying a D.C. field to the silicon oxide films during the process of manufacturing semiconductor devices. As will be described later, the present invention is applicable not only to silicon oxide films but also to any other similar insulating films which are formed in semiconductor devices. Furthermore, the present invention is effective in the removal of not only alkali ions alone, but also the positively charged and negatively charged ions.

Figure 3:
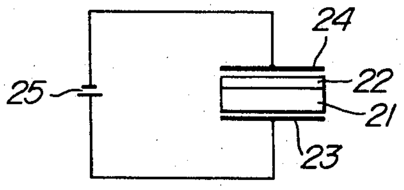
FIG. 3 is a schematic diagram showing an embodiment of the present invention.

The present invention will now be described in further detail in connection with FIG. 3. In this drawing, the illustrated embodiment of the invention concerns a device where the semiconductor consists of silicon, and where a silicon oxide film is formed on this semiconductor substrate. In FIG. 3, reference numeral 21 represents a silicon substrate. Numeral 22 represents a silicon oxide film formed on said substrate. Numerals 23 and 24 represent electrodes connected to a power source 25. The silicon substrate 21 having the aforesaid silicon oxide film 22 is interposed between the electrodes 23 and 24. It is to be noted, however, that the distance between the film-coated semiconductor substrate and the electrodes 23 and 24 are given simply for the convenience of description. In practice, these elements may be disposed in close contact with each other. For instance, an embodiment wherein the electrodes are made to closely adhere to the semiconductor substrate and the silicon oxide film by the use of such technique as vacuum evaporation deposition is also an example of the desirable structure. FIG. 3 shows an example where the silicon oxide film 22 is formed on the entire surface of the silicon substrate 21. It will be obvious to those skilled in the art that the present invention can be effectively executed in the case where the silicon oxide film 22 is locally formed on only a desired portion of the surface of the silicon substrate 21. It is only necessary that silicon oxide film be formed so that a required electric field may be applied thereto.

While holding both the silicon substrate 21 and the silicon oxide film 22 at 100° C. or above, a voltage is applied to the silicon oxide film 22 in such a direction as will cause the surface of the silicon oxide film 22 to face the negative electrode. Then, those alkali ions which have now become easily movable due to the rise in the temperature will, owing to their being positively charged, concentrate near the surface of said silicon oxide film at the end of a predetermined period of time. While continuing the application of said electric field to keep this collected state of ions, the silicon substrate 21 and the silicon oxide film 22 are cooled to room temperature or to a temperature close to room temperature or in other words, to a temperature at which it is practically difficult for the alkali ions to move. Thus, alkali ions are held in a state in which they are fixed to the surface of the silicon oxide film 22. Thereafter, the electric field is released, and the surface of the silicon oxide film 22 is etched off by a minute depth, with the result that alkali ions have now been removed completely from the silicon oxide film 22 and will no longer affect the characteristic of the semiconductor device.

In case, however, there are a great number of alkali ions present in the silicon oxide film 22, it will become impossible to apply an electric field, sufficient to cause the ions to migrate to the surface, to the entire area of the silicon oxide film due to the polarization of said ions. As a consequence, only one treatment of the type as described will not result in complete expulsion of alkali ions from the film. It will, therefore, be necessary to repeat the foregoing treatment several times as required.

It is to be noted also that by selecting the type of the material of the electrode 23 so that this electrode 23 may be connected in ohmic contact with the silicon substrate 21 at the time the metal constituting the electrode 23 is made to adhere to the silicon substrate 21, there is provided the advantage that the voltage which is required of the power source 25 during operation of the device can be reduced greatly.

In order to further elucidate the present invention, description will be made on a MOS transistor where the effect of the alkali ions located in the silicon oxide film can appear most severely.

EXAMPLE 1

A p-type silicon substrate having a resistivity of 1.0 Ω cm. and having a gate insulator consisting of a silicon oxide film of 1000 A. in thickness formed on the surface thereof was prepared. An aluminium electrode was deposited, by vacuum evaporation technique, onto the reverse side of said substrate where a p-type face was exposed and another electrode was deposited in the same manner onto the face of the silicon oxide film. A voltage ranging from 1 to 30 v. was applied to the device in the manner as shown in FIG. 3. In this state, while applying an electric field of the intensity of $2\times10^7$ v./m. to the silicon oxide film, the silicon substrate was held at 200° C. for 30 minutes. While continuing the application of the electric field, the device was then cooled to room temperature to thereby fix the alkali ions near the surface of the silicon oxide film. After the aluminium electrodes were removed, the surface portion of the silicon oxide film was also removed. The surface portion of the silicon oxide film was removed by the following three depths, namely, 50 A., 100 A. and 200 A. The effect of the expulsion of alkali ions on the silicon oxide film of the silicon substrate thus treated was examined. It was found that, as the voltage to be impressed, a voltage as low as 1 v. was sufficient, and this was found to correspond to 30 v. in a conventional device. It was also found that a depth of 50 A. was sufficient for that portion of the silicon oxide film that required removing and that there was no need of removing any more. An examination was also conducted on the silicon oxide film after the overlying aluminium electrode had been removed but prior to the etching off of the surface portion of said film. In this instance also, the absence of alkali ions was noted. In view of the fact, however, that hydrochloric acid was used in the removal of the aluminium electrode so as to leave the surface of the silicon oxide film almost unetched, the foregoing result was considered as being due probably to the removal of the aluminium electrode.

The silicon substrate having a silicon oxide film which had been deprived of alkali ions in the manner as has been described was then subjected to a series of processes including the pattern etching for forming windows for the source and the drain, the deposition of an electrode metal such as aluminium by evaporation, the pattern etching for shaping the deposited metal into electrodes of the required shape, bonding, capping and bias temperature treatment, to produce a MOS transistor. When the transistors of this type which had been completed in the manner described above were held at 180° C. for 2 hours while a voltage of ±4 v. was applied between the gate and the shortcircuited source and drain, there came out not a single device to be rejected in several hundred test pieces. From the comparison with the result of the conventional devices which were not subject to the alkali-ion-elimination treatment of the invention, and hence which were warranted for only 2 hours at 100° C., it was confirmed that the device obtained according to the present invention had a stability which was by far superior to that of the devices of the prior art.

EXAMPLE 2

A p-type silicon substrate of 0.2 mm. thick and having resistivity of 2 Ω cm. on which was grown a silicon oxide film of 1000 A. in thickness and having the formation of windows for the source and the drain and having an n-type diffused layer disposed on the reverse face was prepared. This was interposed between two plate electrodes facing each other at a distance of 0.5 mm. An insulating film having the thickness of 0.1 mm. was inserted between one of said plate electrodes and the reverse face of the silicon substrate. A voltage of 3000 v. was applied between the two electrodes. An electric field was applied to this assembly while holding it at 250° C. for 2 hours in a dry mixed gas atmosphere consisting of nitrogen and hydrogen. Thereafter, while continuing the application of the electric field, the assembly was cooled to room temperature. Then, the surface portion of the silicon oxide film was removed by a thickness of 100 A. Thereafter, a series of processings identical to those described in Example 1 were applied, and thus, a MOS transistor was completed. The stability of this device was examined. More specifically, when the device was held at 160° C. for 2 hours while a voltage was applied between the source and the drain in the direction in which the gate was positively charged, there was found no single device to be rejected in several hundred test pieces.

As has been described, the present invention not only can completely eliminate alkali ions which are present in silicon oxide films, but also it can be applied effectively to insulating films other than silicon oxide films and also to ions other than alkali ions, and furthermore it is outstandingly effective in stabilizing the characteristics of semiconductor devices having insulating films.

As a means of reducing the aforesaid behavior of alkali ions, there are the known techniques of vitrifying the surfaces of silicon oxides into glass such as phosphorus oxide-silicon oxide, lead oxide-silicon oxide and titanium oxide-silicon oxide. It is to be noted, however, that the same effect of the present invention can be obtained from vitrifying the surfaces of the silicon oxide films after having removed alkali ions therefrom according to the afore-described method of this invention.

It is also to be noted that the present invention is not restricted to transistors and diodes alone, and that it can be effectively applied also to integrated circuits comprising a number of transistors or diodes assembled on a single substrate. In this latter instance, it is often advantageous to apply this invention to the entire surface of the insulating film instead of restricting the application to only the area of active elements.

What is claimed is:

1. A method of producing semiconductor devices having an insulating film formed locally or entirely on the surface of a semiconductor body, characterized by the steps of: applying a D.C. electric field to said insulating film to transfer ions present in said insulating film to the surface thereof, and thereafter removing said ions from said surface of said insulating film prior to depositing an electrode metal required by said semiconductor device in its completed state onto said semiconductor or onto said insulating film.

References Cited

UNITED STATES PATENTS

| | | |
|---|---|---|
| 2,791,759 | 5/1957 | Brown. |
| 3,311,756 | 3/1967 | Nagata et al. |
| 3,328,210 | 6/1967 | McCaldin et al. |

WILLIAM I. BROOKS, *Primary Examiner.*

U.S. Cl. X.R.

29—571, 590; 117—54